United States Patent
Taniguchi et al.

(10) Patent No.: US 9,787,282 B2
(45) Date of Patent: Oct. 10, 2017

(54) PIEZOELECTRIC THIN FILM RESONATOR, FILTER AND DUPLEXER

(71) Applicant: TAIYO YUDEN CO., LTD., Tokyo (JP)

(72) Inventors: Shinji Taniguchi, Tokyo (JP); Tokihiro Nishihara, Tokyo (JP); Tsuyoshi Yokoyama, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 87 days.

(21) Appl. No.: 14/527,335

(22) Filed: Oct. 29, 2014

(65) Prior Publication Data

US 2015/0130561 A1 May 14, 2015

(30) Foreign Application Priority Data

Nov. 11, 2013 (JP) ................................. 2013-233420

(51) Int. Cl.
*H03H 9/15* (2006.01)
*H03H 9/54* (2006.01)
(Continued)

(52) U.S. Cl.
CPC ........ *H03H 9/173* (2013.01); *H03H 9/02118* (2013.01); *H03H 9/175* (2013.01);
(Continued)

(58) Field of Classification Search
CPC ........... H03H 9/02102; H03H 9/02015; H03H 9/02047; H03H 9/02086; H03H 9/02118;
(Continued)

(56) References Cited

U.S. PATENT DOCUMENTS 4,456,850 A 6/1984 Inoue et al.
8,084,919 B2 12/2011 Nishihara et al.
(Continued)

FOREIGN PATENT DOCUMENTS

CN 101064499 A 10/2007
CN 101796726 A 8/2010
(Continued)

OTHER PUBLICATIONS

Chinese Office Action dated Mar. 4, 2016, in a counterpart Chinese patent application No. 201410042168.9.
(Continued)

*Primary Examiner* — Barbara Summons
(74) *Attorney, Agent, or Firm* — Chen Yoshimura LLP

(57) ABSTRACT

A piezoelectric thin film resonator includes: a substrate; a piezoelectric film provided on the substrate; a lower electrode and an upper electrode that sandwich at least a part of the piezoelectric film and face with each other; and an inserted film that is inserted in the piezoelectric film, is provided on an outer circumference region in a resonance region in which the lower electrode and the upper electrode sandwich the piezoelectric film and face with each other, is not provided in a center region of the resonance region, and has a cutout in the resonance region.

14 Claims, 17 Drawing Sheets

(51) Int. Cl.
  *H03H 9/70* (2006.01)
  *H03H 9/17* (2006.01)
  *H03H 9/56* (2006.01)
  *H03H 9/02* (2006.01)

(52) U.S. Cl.
  CPC ............ *H03H 9/564* (2013.01); *H03H 9/568* (2013.01); *H03H 9/706* (2013.01)

(58) Field of Classification Search
  CPC .......... H03H 9/13; H03H 9/131; H03H 9/132; H03H 9/173; H03H 9/174; H03H 9/175; H03H 9/568; H03H 9/587; H03H 9/588; H03H 9/70; H03H 9/703; H03H 9/706; H03H 9/54; H03H 9/564; H01L 41/18; H01L 41/287; H01L 41/1875; H01L 41/1876
  USPC .......................................... 333/133, 187, 189
  See application file for complete search history.

(56) References Cited

U.S. PATENT DOCUMENTS

| | | |
|---|---|---|
| 9,048,812 B2 | 6/2015 | Burak et al. |
| 9,099,983 B2 | 8/2015 | Burak et al. |
| 2006/0071736 A1 | 4/2006 | Ruby et al. |
| 2006/0091764 A1 | 5/2006 | Tsutsumi et al. |
| 2006/0103492 A1 | 5/2006 | Feng et al. |
| 2006/0279382 A1 | 12/2006 | Ohara et al. |
| 2007/0080611 A1 | 4/2007 | Yamada et al. |
| 2007/0252476 A1 | 11/2007 | Iwaki et al. |
| 2009/0206706 A1 | 8/2009 | Iwaki et al. |
| 2010/0033063 A1 | 2/2010 | Nishihara et al. |
| 2010/0141353 A1 | 6/2010 | Iwaki et al. |
| 2010/0148636 A1 | 6/2010 | Nishihara et al. |
| 2011/0006860 A1 | 1/2011 | Hara et al. |
| 2012/0218060 A1 | 8/2012 | Burak et al. |
| 2014/0210570 A1 | 7/2014 | Nishihara et al. |
| 2015/0130559 A1 | 5/2015 | Yokoyama et al. |
| 2015/0130561 A1 | 5/2015 | Taniguchi et al. |

FOREIGN PATENT DOCUMENTS

| | | | |
|---|---|---|---|
| CN | 101960717 A | | 1/2011 |
| JP | 2006-109472 A | | 4/2006 |
| JP | 2008-131194 A | * | 6/2008 |
| JP | 2008-219237 A | | 9/2008 |

OTHER PUBLICATIONS

U.S. Appl. Nos. 14/151,694, filed Jan. 9, 2014 and 14/519,803, filed Oct. 21, 2014.

Japanese Office Action dated Aug. 29, 2017, in a counterpart Japanese patent application No. 2013-233420.

* cited by examiner

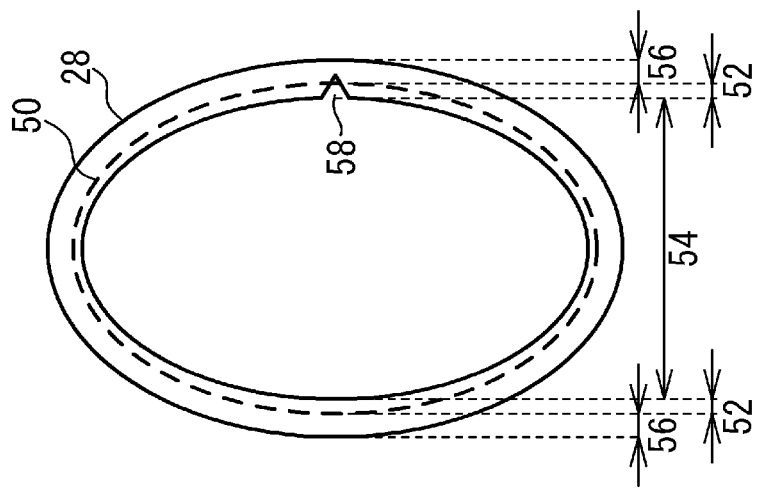
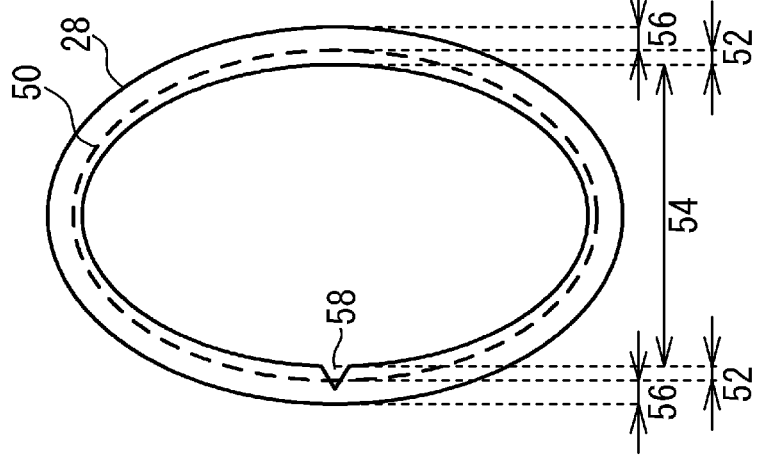
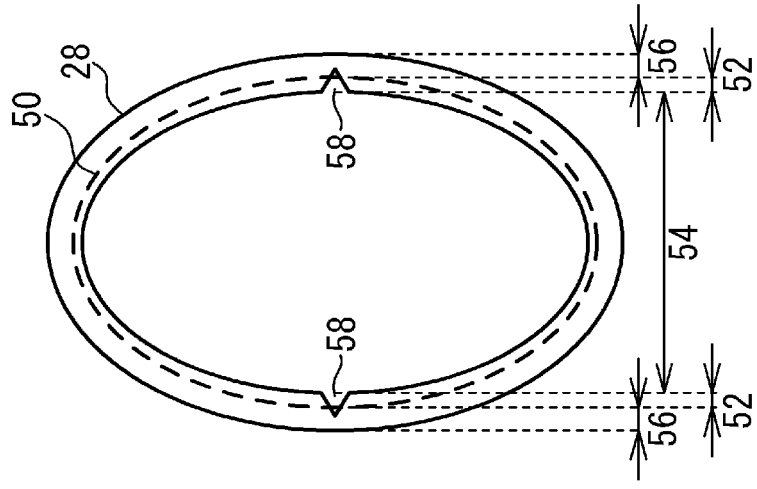

PIEZOELECTRIC THIN FILM RESONATOR, FILTER AND DUPLEXER

CROSS-REFERENCE TO RELATED APPLICATION

This application is based upon and claims the benefit of priority of the prior Japanese Patent Application No. 2013-233420, filed on Nov. 11, 2013, the entire contents of which are incorporated herein by reference.

FIELD

A certain aspect of the present invention relates to a piezoelectric thin film resonator, a filter and a duplexer, and in particular, relates to a piezoelectric thin film resonator, a filter and a duplexer that have an inserted film in a piezoelectric film.

BACKGROUND

An acoustic wave device using a piezoelectric thin film resonator is used as a filter and a duplexer of a wireless device such as a mobile phone. The piezoelectric thin film resonator has a structure a lower electrode and an upper electrode sandwich a piezoelectric film and face with each other.

As a wireless system rapidly spreads, many frequency bands are being used. As a result, sharpening of skirt characteristic of a filter or a duplexer is requested. There is a method of enlarging a Q value of a piezoelectric thin film resonator as one method of sharpening the skirt characteristic. Acoustic wave energy may be leaked to outside from a resonance region, as a factor of degradation of the Q value of a piezoelectric thin film resonator.

Japanese Patent Application Publication No. 2006-109472 (hereinafter referred to as Document 1) discloses that the Q value is improved by providing a ring band on a surface of a lower electrode or an upper electrode.

SUMMARY OF THE INVENTION

According to an aspect of the present invention, there is provided a piezoelectric thin film resonator including: a substrate; a piezoelectric film provided on the substrate; a lower electrode and an upper electrode that sandwich at least a part of the piezoelectric film and face with each other; and an inserted film that is inserted in the piezoelectric film, is provided on an outer circumference region in a resonance region in which the lower electrode and the upper electrode sandwich the piezoelectric film and face with each other, is not provided in a center region of the resonance region, and has a cutout in the resonance region.

According to another aspect of the present invention, there is provided a filter including a piezoelectric thin film resonator including: a substrate; a piezoelectric film provided on the substrate; a lower electrode and an upper electrode that sandwich at least a part of the piezoelectric film and face with each other; and an inserted film that is inserted in the piezoelectric film, is provided on an outer circumference region in a resonance region in which the lower electrode and the upper electrode sandwich the piezoelectric film and face with each other, is not provided in a center region of the resonance region, and has a cutout in the resonance region.

According to another aspect of the present invention, there is provided a duplexer including a transmit filter and a receive filter, wherein at least one of the transmit filter and the receive filter is a filter comprising a piezoelectric thin film resonator including: a substrate; a piezoelectric film provided on the substrate; a lower electrode and an upper electrode that sandwich at least a part of the piezoelectric film and face with each other; and an inserted film that is inserted in the piezoelectric film, is provided on an outer circumference region in a resonance region in which the lower electrode and the upper electrode sandwich the piezoelectric film and face with each other, is not provided in a center region of the resonance region, and has a cutout in the resonance region.

BRIEF DESCRIPTION OF THE DRAWINGS

FIG. 5A to FIG. 5C illustrate a plane view of a cutout;

DETAILED DESCRIPTION

The structure of Document 1 cannot sufficiently suppress the acoustic wave energy leaked toward outside from the resonance region. Therefore, the improvement of the Q value is not sufficient. When the Q value is improved, spurious that is equal to or less than a resonance frequency may increase, and a loss may be enlarged.

A description will be given of embodiments with reference to drawings.

First Embodiment

Figure 1A:
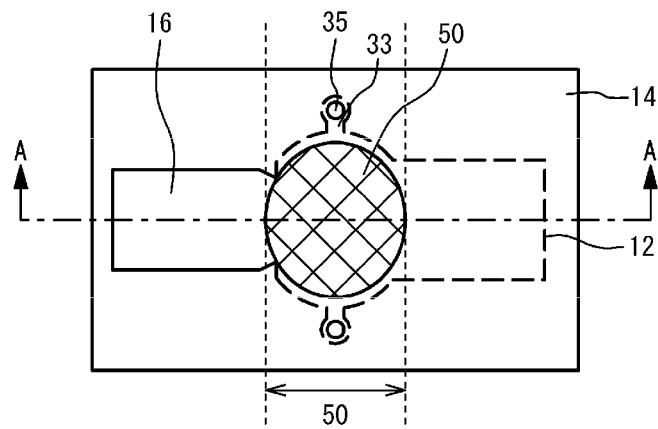
FIG. 1A illustrates a plane view of a piezoelectric thin film resonator in accordance with a first embodiment.
Figure 1B:
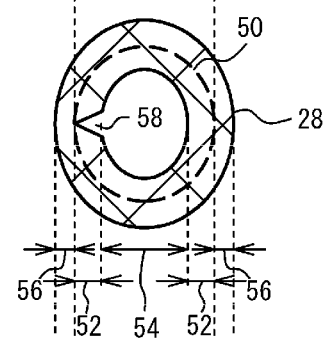
FIG. 1B illustrates a plane view of an inserted film.
Figure 1C:
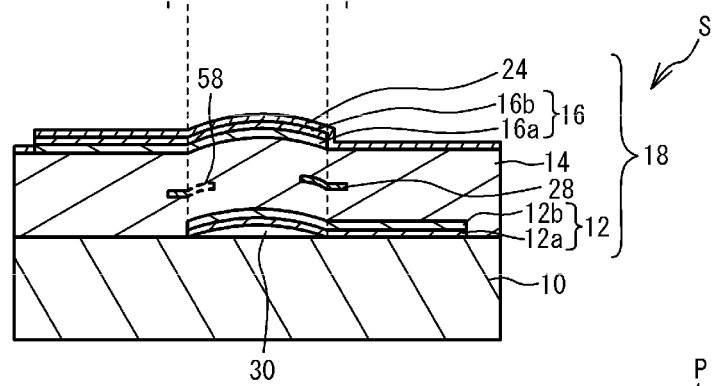
FIG. 1C and FIG. 1D illustrate a cross sectional view taken along a line A-A of FIG. 1A.
Figure 1D:
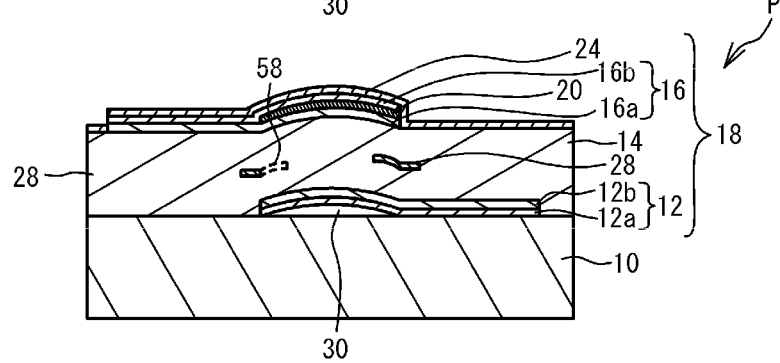

FIG. 1A illustrates a plane view of a piezoelectric thin film resonator in accordance with a first embodiment. FIG. 1B illustrates a plane view of an inserted film. FIG. 1C and FIG. 1D illustrate a cross sectional view taken along a line A-A of FIG. 1A. FIG. 1C illustrates a cross sectional view of a series resonator of a ladder type filter. FIG. 1D illustrates a cross sectional view of a parallel resonator of a ladder type filter.

With reference to FIG. 1A and FIG. 1C, a description will be given of a structure of a series resonator S. A lower electrode 12 is provided on a substrate 10 that is a silicon (Si) substrate. A cavity 30 having a dome-shaped bulge is formed between a flat main face of the substrate 10 and the lower electrode 12. The dome-shaped bulge is a bulge in which a height of the cavity 30 is smaller around the cavity 30 and the height of the cavity 30 is larger inside of the cavity 30. The lower electrode 12 has a lower layer 12a and an upper layer 12b. The lower layer 12a is, for example, a Cr (chrome) film. The upper layer 12b is, for example, a Ru (ruthenium) film.

A piezoelectric film 14 of which main component is aluminum nitride (AlN) having a main axis of (002) direction is provided on the lower electrode 12. An inserted film 28 is provided in the piezoelectric film 14. The inserted film 28 is approximately provided at a center of the piezoelectric film 14 in a film thickness direction. The inserted film 28 may be provided in a region other than the center. However, when the inserted film 28 is provided at the center of the piezoelectric film 14, the function of the inserted film is enhanced. An upper electrode 16 is provided on the piezoelectric film 14 so that a region (resonance region 50) in which the lower electrode 12 and the upper electrode 16 sandwich the piezoelectric film 14 and face with each other is formed. The resonance region 50 has an ellipse shape and is a region in which an acoustic wave of a thickness longitudinal oscillation mode resonates. The upper electrode 16 has a lower layer 16a and an upper layer 16b. The lower layer 16a is, for example, a Ru film. The upper layer 16b is, for example, a Cr film.

A silicon oxide film acting as a frequency adjusting film 24 is formed on the upper electrode 16. A lamination film 18 in the resonance region 50 has the lower electrode 12, the piezoelectric film 14, the inserted film 28, the upper electrode 16 and the frequency adjusting film 24. The frequency adjusting film 24 may act as a passivation film.

As illustrated in FIG. 1A, a guide path 33 for performing an etching to a sacrifice layer is formed in the lower electrode 12. The sacrifice layer is a layer for forming the cavity 30. A region around an edge of the guide path 33 is not covered by the piezoelectric film 14. The lower electrode 12 has a hole portion 35 at an edge of the guide path 33.

With reference to FIG. 1A and FIG. 1D, a description will be given of a structure of the parallel resonator P. The parallel resonator P is different from the series resonator S in a point that a mass load film 20 is provided between the lower layer 16a and the upper layer 16b of the upper electrode 16. The mass load film 20 is, for example, a Ti (titanium) film. Therefore, the lamination film 18 includes the mass load film 20 formed on a whole face in the resonance region 50 in addition to the lamination film of the series resonator S. Other structures are the same as FIG. 1C of the series resonator S. Therefore, an explanation of the structures is omitted.

A resonance frequency difference between the series resonator S and the parallel resonator P is adjusted with use of a film thickness of the mass load film 20. The resonance frequency of both the series resonator S and the parallel resonator P is adjusted by adjusting the film thickness of the frequency adjusting film 24.

In a case of a piezoelectric thin film resonator having a resonance frequency of 2 GHz, the lower layer 12a of the lower electrode 12 is a Cr film. A thickness of the lower layer 12a is 100 nm. The upper layer 12b of the lower electrode 12 is a Ru film. A thickness of the upper layer 12b is 250 nm. The piezoelectric film 14 is an AlN film. A thickness of the piezoelectric film 14 is 1100 nm. The inserted film 28 is a silicon oxide ($SiO_2$) film. A thickness of the inserted film 28 is 150 nm. The lower layer 16a of the upper electrode 16 is a Ru film. A thickness of the lower layer 16a is 250 nm. The upper layer 16b of the upper electrode 16 is a Cr film. A thickness of the upper layer 16b is 50 nm. The frequency adjusting film 24 is a silicon oxide film. A thickness of the frequency adjusting film 24 is 50 nm. The mass load film 20 is a Ti film. A thickness of the mass load film 20 is 120 nm. The film thickness of each layer may be arbitrarily set to achieve a desirable resonance characteristic.

As illustrated in FIG. 1B, the inserted film 28 is provided in an outer circumference region 52 of the resonance region 50 but is not provided in a center region 54. The outer circumference region 52 is a region in the resonance region 50, includes the outer circumference of the resonance region 50 and is along with the outer circumference of the resonance region 50. The outer circumference region 52 has a stripe shape or a ring shape. The center region 54 is a region in the resonance region 50 and is a region including a center of the resonance region 50. The center may be a position other than a geometric center. The inserted film 28 is provided in a region 56 surrounding the resonance region 50 in addition to the outer circumference region 52. The inserted film 28 may be continuously provided from the outer circumference region 52 to outside of the resonance region 50. A cutout 58 (concave portion) is formed in the inserted film 28. The cutout 58 extends from the center region 54 toward outside.

A quartz substrate, a glass substrate, a ceramics substrate, a GaAs substrate or the like other than the Si substrate may be used as the substrate 10. A single layer film or a lamination film of Al (aluminum), Ti, Cu (copper), Mo (molybdenum), W (tungsten), Ta (tantalum), Pt (platinum), Rh (rhodium), Ir (iridium) or the like other than Ru and Cr may be used as the lower electrode 12 and the upper electrode 16. For example, the lower layer 16a of the upper electrode 16 may be Ru. The upper layer 16b of the upper electrode 16 may be Mo. ZnO (zinc oxide), PZT (lead zirconate titanate), $PbTiO_3$ (lead titanate) or the like other than the aluminum nitride may be used as the piezoelectric film 14. For example, the piezoelectric film 14 may have aluminum nitride as a main component and may include another element for improving resonance characteristic or improving piezoelectricity. For example, when Sc (scandium) is used as a dopant element, the piezoelectricity of the piezoelectric film 14 is improved. It is therefore possible to improve an effective electromechanical coupling coefficient of the piezoelectric thin film resonator.

It is preferable that the inserted film 28 may be made of a material having a Young's modulus smaller than that of the piezoelectric film 14 such as Al, Au, Cu, Ti, Pt, Ta, Cr or $SiO_2$. Thus, a Q value may be improved. When a metal film is used as the inserted film 28, an effective electromechanical coupling coefficient may be improved. Details will be described later.

A silicon nitride film, an aluminum nitride film or the like other than the silicon oxide film may be used as the frequency adjusting film 24. A single-layer film such as Ru, Cr, Al, Cu, Mo, W, Ta, Pt, Rh, Ir or the like other than Ti may be used as the mass load film 20. For example, an insulating film made of a nitride metal or an oxide metal such as silicon nitride or silicon oxide may be used. The mass load film 20 may be formed under the lower electrode 12, between layers of the lower electrode 12, on the upper electrode 16, between the lower electrode 12 and the piezoelectric film 14 or between the piezoelectric film 14 and the upper electrode 16. The mass load film 20 may be larger than the resonance region 50 when the mass load film 20 includes the resonance region 50.

Figure 2A:
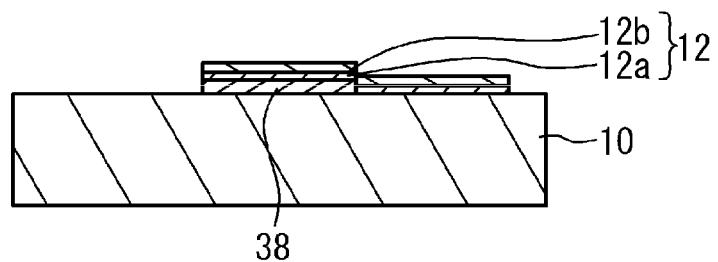
FIG. 2A to FIG. 2C illustrate a cross sectional view for describing a manufacturing method of a series resonator in accordance with a first embodiment.
Figure 2B:
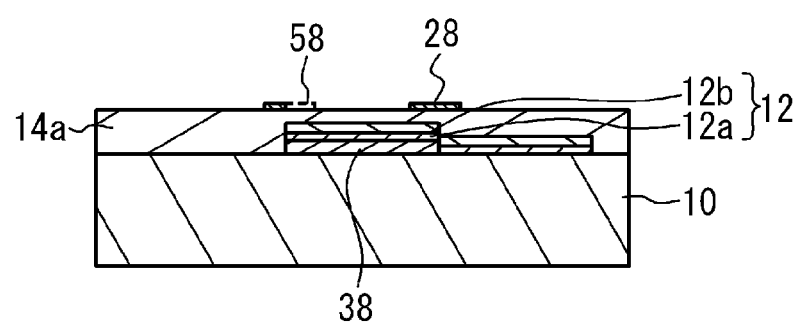
Figure 2C:
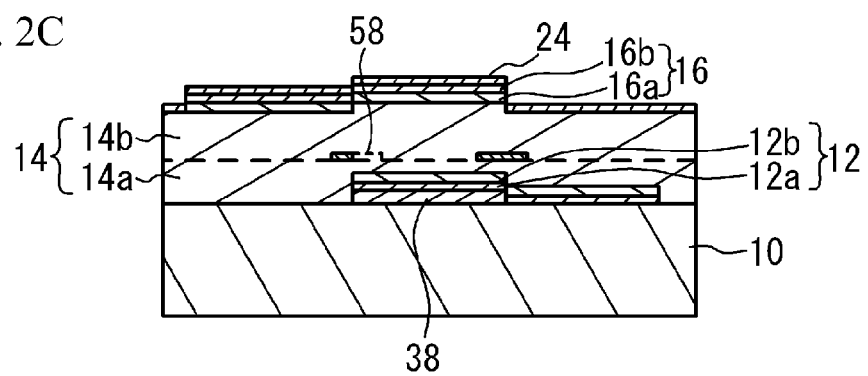

FIG. 2A to FIG. 2C illustrate a cross sectional view for describing a manufacturing method of the series resonator in accordance with the first embodiment. As illustrated in FIG. 2A, a sacrifice layer 38 for forming a cavity on the substrate 10 having a flat main face is formed. A thickness of the sacrifice layer 38 is, for example, 10 to 100 nm. The material of the sacrifice layer 38 is selected from materials that easily dissolved in etching liquid or etching gas such as MgO, ZnO, Ge or $SiO_2$. After that, the sacrifice layer 38 is subjected to a patterning with use of a photolithography technology and an etching technology and is formed into a desirable shape. The shape of the sacrifice layer 38 corresponds to the plane shape of the cavity 30. And the sacrifice layer 38 includes a region to be the resonance region 50. Next, the lower layer 12a and the upper layer 12b are formed on the sacrifice layer 38 and the substrate 10 as the lower electrode 12. The sacrifice layer 38 and the lower electrode 12 are, for example, formed with use of a sputtering method, a vacuum vapor deposition method or a CVD (Chemical Vapor Deposition) method. After that, the lower electrode 12 is subjected to a patterning with use of a photolithography technology and an etching technology and is formed into a desirable shape. The lower electrode 12 may be formed by a lift-off method.

As illustrated in FIG. 2B, a piezoelectric film 14a and the inserted film 28 are formed on the lower electrode 12 and the substrate 10 with use of a sputtering method, a vacuum vapor deposition method, a CVD method or the like. The inserted film 28 is subjected to a patterning with use of a photolithography technology and an etching technology and is formed into a desirable shape. The inserted film 28 may be formed by a lift-off method. The cutout 58 is formed in the inserted film 28.

As illustrated in FIG. 2C, a piezoelectric film 14b, the lower layer 16a and the upper layer 16b of the upper electrode 16 are formed with use of a sputtering method, a vacuum vapor deposition method or a CVD method. The piezoelectric film 14 is formed from the piezoelectric films 14a and 14b. The upper electrode 16 is subjected to a patterning with use of a photolithography technology and an etching technology and is formed into a desirable shape. The upper electrode 16 may be formed by a lift-off method.

In the parallel resonator illustrated in FIG. 1D, after forming the lower layer 16a, the mass load film 20 is formed by a sputtering method, a vacuum vapor deposition method, a CVD method or the like. The mass load film 20 is subjected to a patterning with use of a photolithography technology and an etching technology and is formed into a desirable shape. After that, the upper layer 16b is formed.

The frequency adjusting film 24 is formed by a sputtering method, a CVD method or the like. The frequency adjusting film 24 is subjected to a patterning with use of a photolithography technology and an etching technology and is formed into a desirable shape.

After that, the etching liquid of the sacrifice layer 38 is guided to the sacrifice layer 38 under the lower electrode 12 via the hole portion 35 and the guide path 33 (with reference to FIG. 1A). Thus, the sacrifice layer 38 is removed. It is preferable that a medium for etching of the sacrifice layer 38 is a medium that does not etch materials of the resonator other than the sacrifice layer 38. In particular, it is preferable that the etching medium is a medium that does not etch the lower electrode 12 contacting the etching medium. A stress of the lamination film 18 (with reference to FIG. 1C and FIG. 1D) is set to be a compression stress. Thus, when the sacrifice layer 38 is removed, the lamination film 18 expands so as to get away from the substrate 10 toward an opposite side of the substrate 10. The cavity 30 having a dome-shaped bulge between the lower electrode 12 and the substrate 10 is formed. With the processes, the series resonator S illustrated in FIG. 1A and FIG. 1C and the parallel resonator P illustrated in FIG. 1A and FIG. 1D are formed.

Figure 3A:
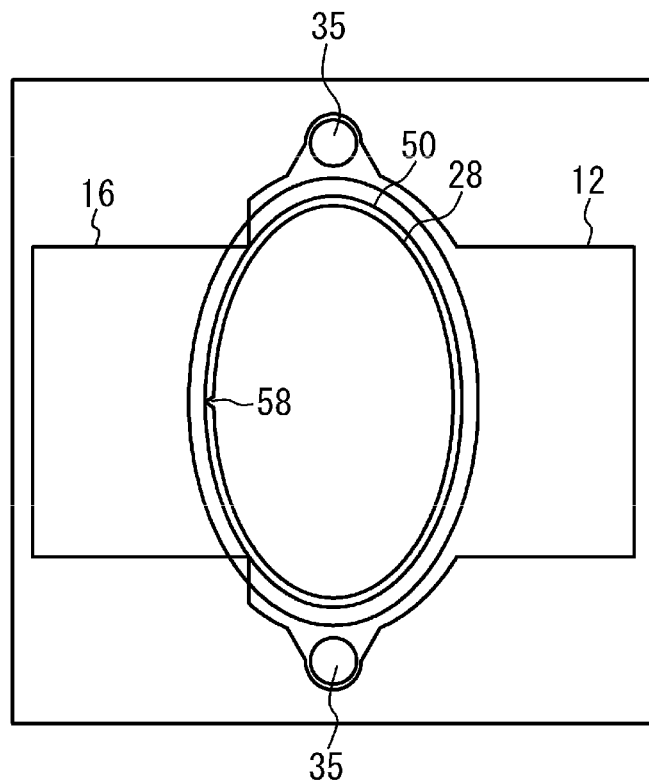
FIG. 3A and FIG. 3B illustrate a plane view around an inserted film of a first embodiment.
Figure 3B:
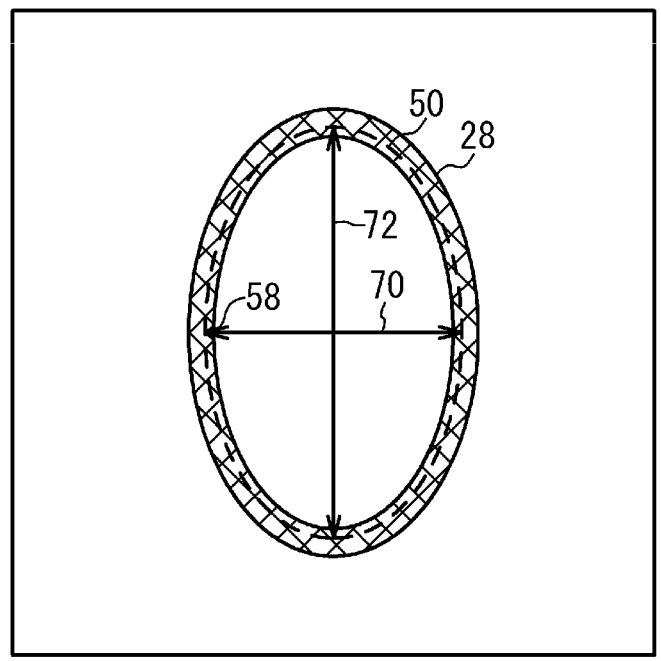

FIG. 3A and FIG. 3B illustrate a plane view around the inserted film of the first embodiment. In order to achieve actual scale, FIG. 3A and FIG. 3B have a different scale from FIG. 1A and FIG. 1B. FIG. 4A to FIG. 6C have a different scale from FIG. 1A and FIG. 1B. As illustrated in FIG. 3A, a region in which the upper electrode 16 overlaps the lower electrode 12 is the resonance region 50. As illustrated in FIG. 3B, the inserted film 28 has a constant width from inside to outside of the resonance region 50. The resonance region 50 has an ellipse shape having a short axis 70 and a long axis 72. The cutout 58 is formed on an extraction side of the upper electrode 16 around the short axis. The cutout 58 has a substantially triangle shape. An edge of the cutout 58 is approximately consistent with an outer circumference of the resonance region 50.

Figure 4A:
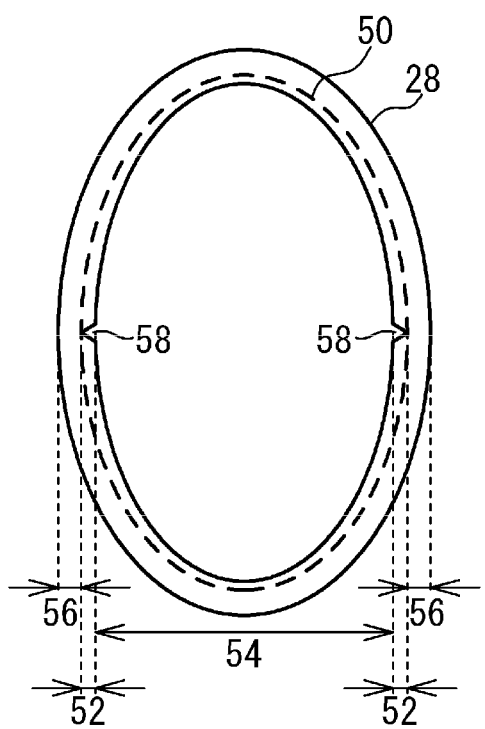
FIG. 4A and FIG. 4B illustrate a plane view of a cutout.
Figure 4B:
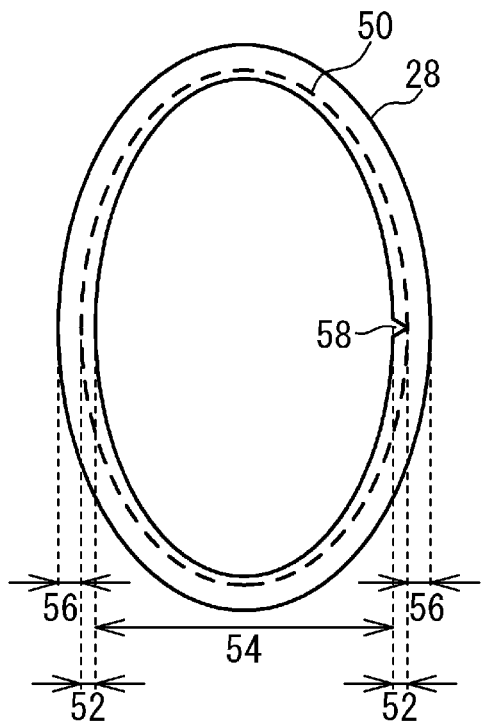

FIG. 4A to FIG. 6C illustrate a plane view of examples of the cutout. As illustrated in FIG. 4A, a plurality of the cutouts 58 may be formed. The plurality of the cutouts 58 may face with each other in the resonance region 50. As illustrated in FIG. 4B, the cutout 58 may be formed on an extraction side of the lower electrode 12 around the short axis.

Figure 6A:
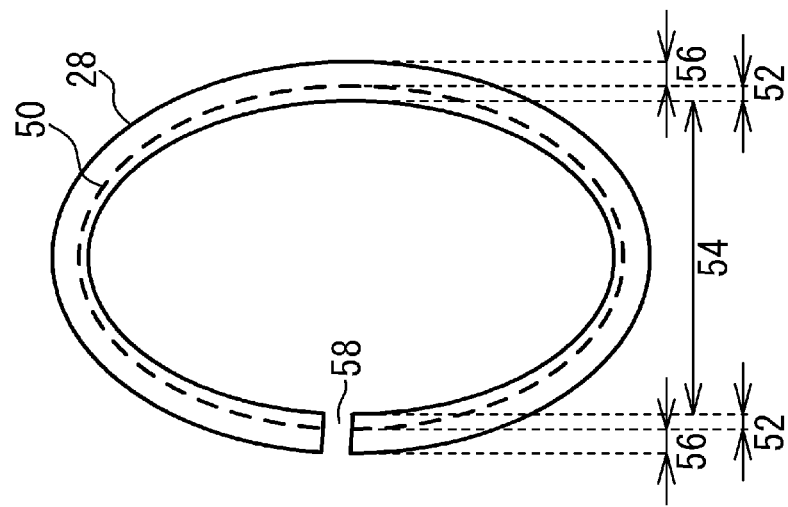
FIG. 6A to FIG. 6C illustrate a plane view of a cutout.
Figure 6B:
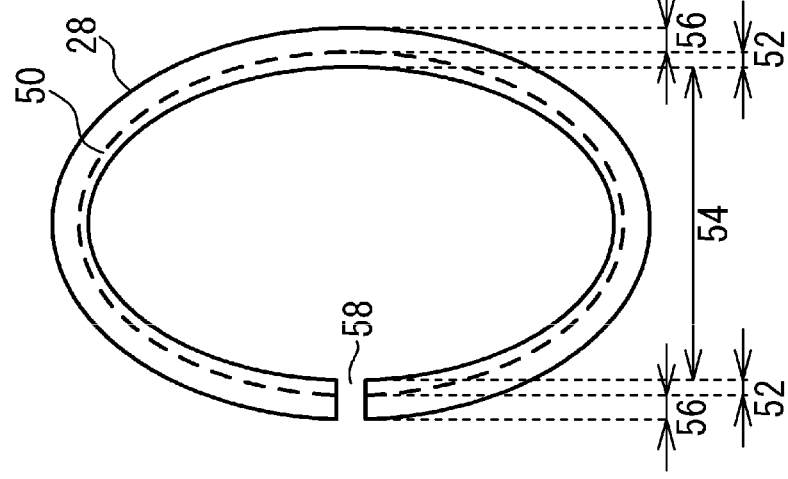
Figure 6C:
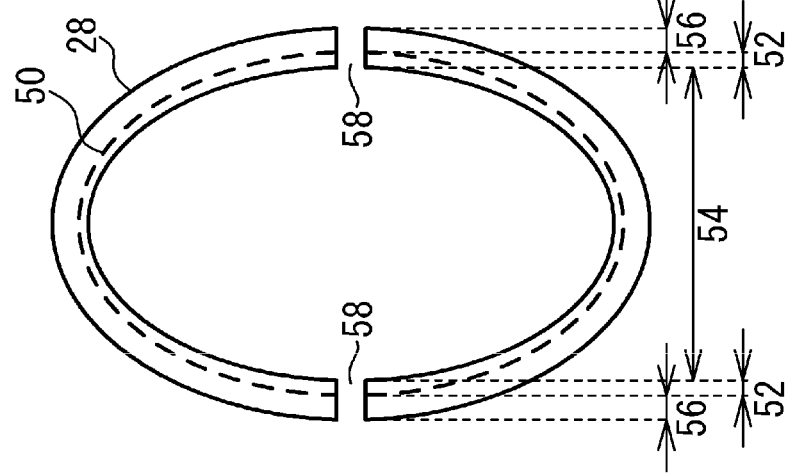

As illustrated in FIG. 5A to FIG. 5C, the cutout 58 may extend to an intermediate of the region 56 surrounding the resonance region 50. As illustrated in FIG. 6A to FIG. 6C, the cutout 58 may divide the inserted film 28. The cutout 58 may have a substantially triangle shape as illustrated in FIG. 3B to FIG. 5C. The cutout 58 may have a substantially rectangular shape as illustrated in FIG. 6A to FIG. 6C. The cutout 58 may have another shape.

Figure 7A:
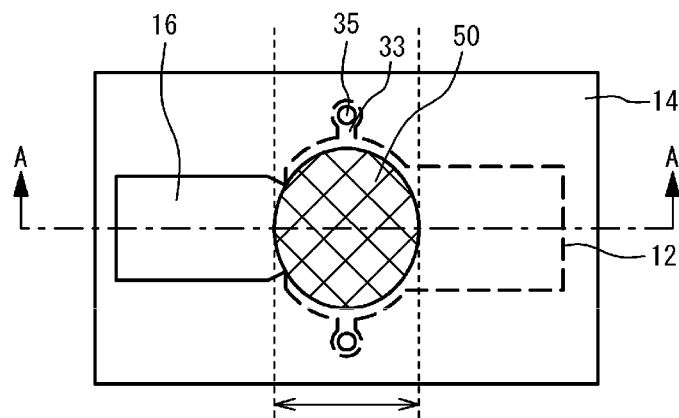
FIG. 7A illustrates a plane view of a piezoelectric thin film resonator in accordance with a first comparative example.
Figure 7B:
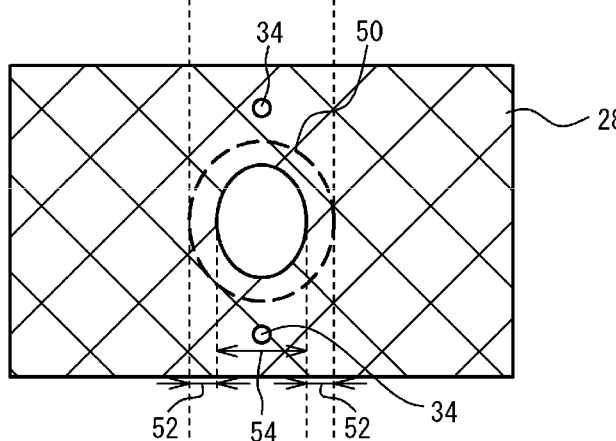
FIG. 7B illustrates a plane view of an inserted film.
Figure 7C:
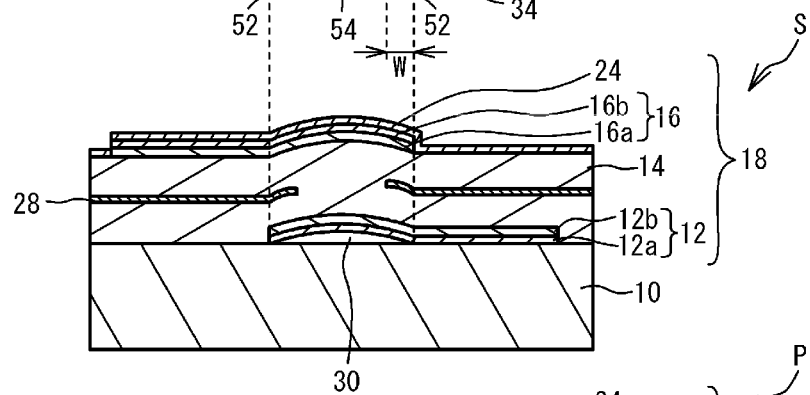
FIG. 7C and FIG. 7D illustrate a cross sectional view taken along a line A-A of FIG. 7A.
Figure 7D:
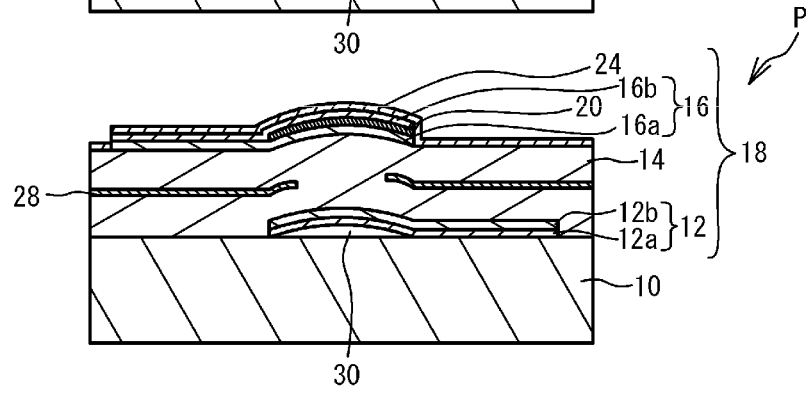

An effect of the inserted film 28 is measured with respect to a first comparative example in which the cutout 58 is not formed. FIG. 7A illustrates a plane view of a piezoelectric thin film resonator in accordance with the first comparative example. FIG. 7B illustrates a plane view of the inserted film. FIG. 7C and FIG. 7D illustrate a cross sectional view taken along a line A-A of FIG. 7A.

As illustrated in FIG. 7A to FIG. 7D, the inserted film 28 does not have a cutout. The inserted film 28 continuously extends toward outside of the resonance region 50. A hole 34 communicating with the hole portion 35 is formed in the inserted film 28. Other structures are the same as FIG. 1A to FIG. 1D of the first embodiment.

In the first comparative example, the material of the inserted film 28 is changed, and the Q value of the anti-resonance frequency is simulated with use of a finite element method. The finite element method is performed by two-dimensional analysis of a cross section as illustrated in FIG. 7C. Each thickness and each material of the lamination film 18 are illustrated as the piezoelectric thin film resonator having a resonance frequency of 2 GHz of FIG. 1A to FIG. 1D. That is, the piezoelectric film 14 is made of AlN. The inserted film 28 is made of silicon oxide. The thickness of the inserted film 28 is 150 nm. A width W in which the resonance region 50 and the inserted film 28 overlap with each other is 2 µm. The inserted film 28 is provided in a center position of the piezoelectric film 14 in the film thickness direction.

Figure 8A:
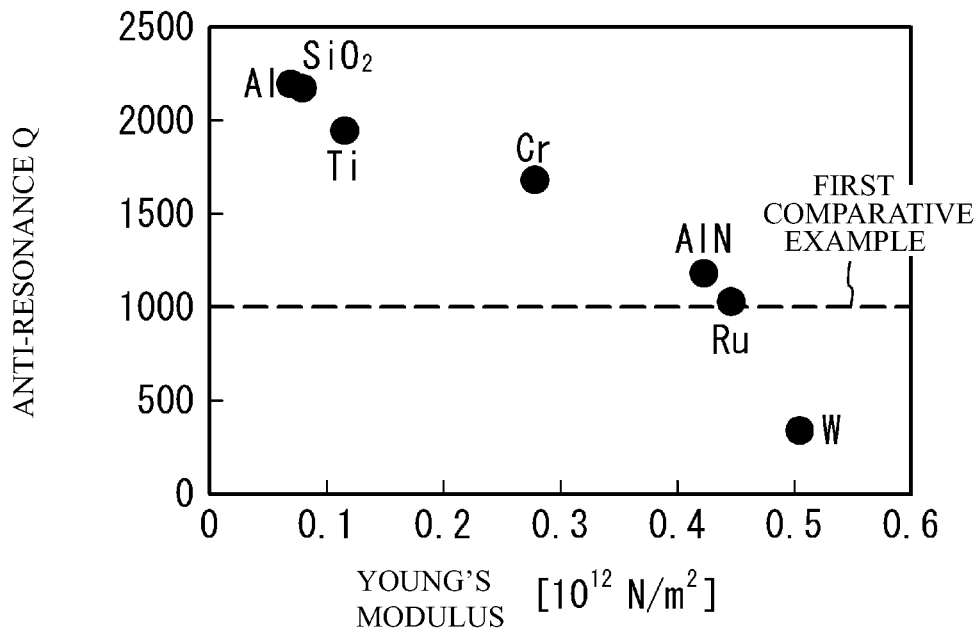
FIG. 8A illustrates a Q value of an anti-resonance frequency with respect to a Young's modulus.
Figure 8B:
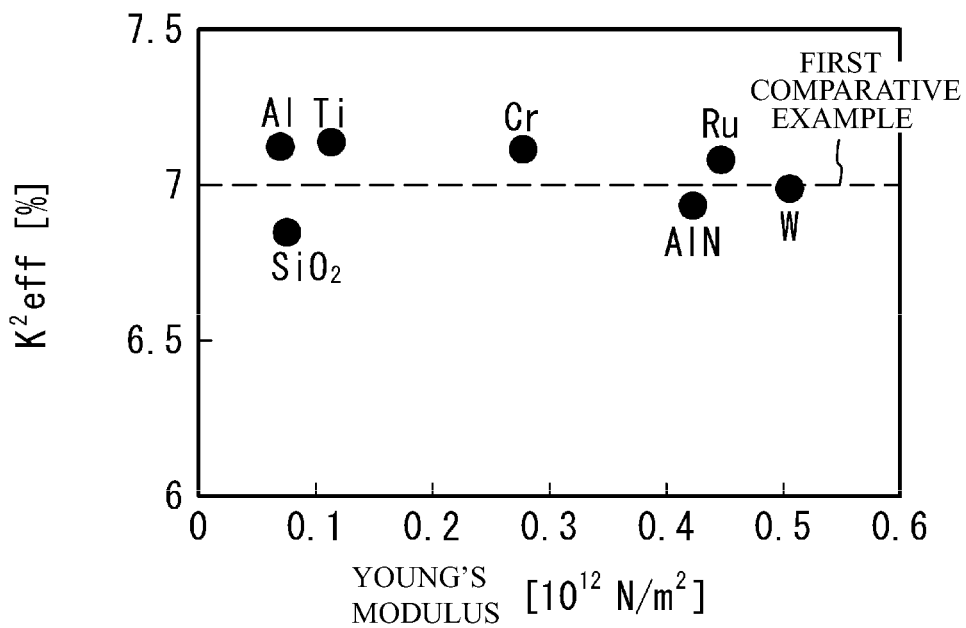
FIG. 8B illustrates an effective electromechanical coupling coefficient $k^2\text{eff}$ with respect to a Young's modulus.

FIG. 8A illustrates a Q value of an anti-resonance frequency with respect to a Young's modulus. FIG. 8B illustrates an effective electromechanical coupling coefficient $k^2$eff with respect to the Young's modulus. The first comparative example corresponds to a resonator not having the inserted film 28. A calculation is performed with respect to the material of the inserted film 28 such as Al, $SiO_2$, Ti, Cr, AlN, Ru or W.

As illustrated in FIG. 8A, when a material having a small Young's modulus is used for the inserted film 28, the Q value of the anti-resonance frequency gets higher. When the Young's modulus is smaller than that of AlN, the Q value is higher than the first comparative example. This is because of the following reasons. That is, when the inserted film 28 having a small Young's modulus is provided in the outer circumference region 52, an oscillation of an acoustic wave is small in the outer circumference region 52 of the resonance region 50. Thus, the outer circumference of the resonance region 50 acts as a fixed end, and an acoustic wave is fixed-end-reflected at the fixed end. Therefore, a leakage of acoustic wave energy toward outside of the resonance region 50 is suppressed. Thus, the Q value gets higher. It is preferable that the Young's modulus of the inserted film 28 is smaller than the Young's modulus of the piezoelectric film 14. It is preferable that the Young's modulus of the inserted film 28 is equal to or less than 90% of the Young's modulus of the piezoelectric film 14. It is more preferable that the Young's modulus of the inserted film 28 is equal to or less than 80% of the Young's modulus of the piezoelectric film 14.

With reference to FIG. 8B, the effective electromechanical coupling coefficient $k^2$eff gets higher when the inserted film 28 is made of metal. This may be because the electrical field distribution of an acoustic wave in the resonance region 50 is equalized when the inserted film 28 is made of metal.

However, it is confirmed that the spurious is enlarged in the equalized inserted film 28 of the first comparative example. When the spurious of a resonator is large, a ripple may occur in a pass band in a case where a filter is structured with use of the resonator. And, a loss may be large.

Figure 9:
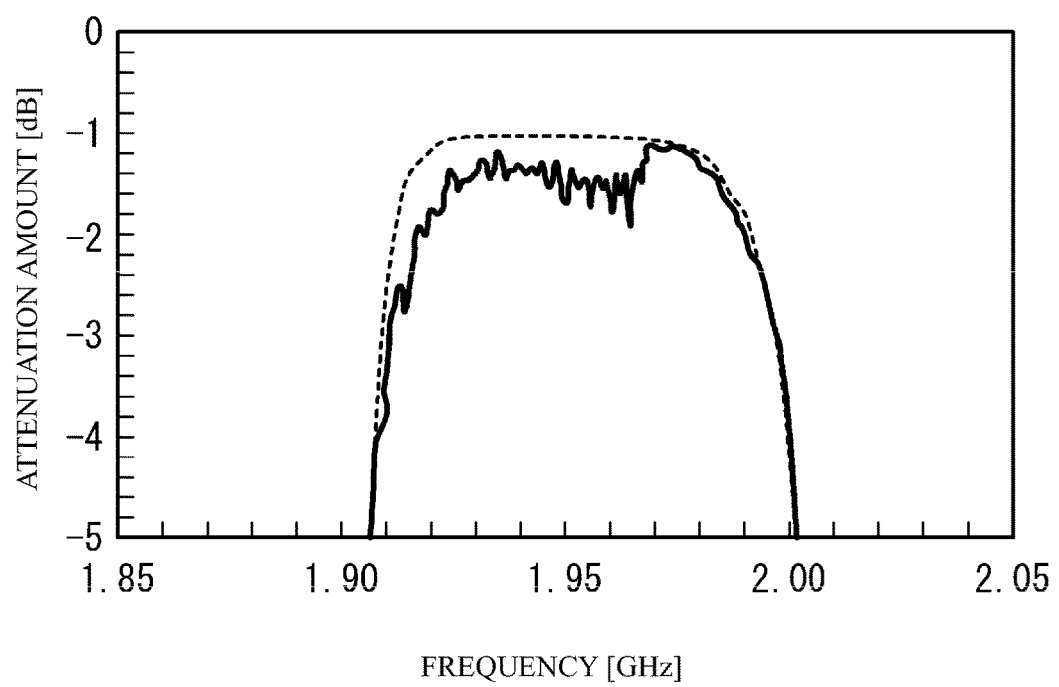
FIG. 9 illustrates pass characteristic of a filter.

FIG. 9 illustrates pass characteristic of a filter. A broken line indicates an ideal pass characteristic. A solid line indicates a calculation example of the pass characteristic in a ladder type filter using a resonator having a spurious. Because of the spurious of the resonator, a ripple may occur in the pass band, and a loss may be degraded. In this manner, suppressing of a spurious of a resonator is requested.

A resonator is manufactured with respect to the first embodiment, the first comparative example and a second comparative example. The manufactured resonators of the first embodiment, the first comparative example and the second comparative example are the follows.

First embodiment: with the inserted film 28 and the cutout 58.

First comparative example: with the inserted film 28 but without the cutout.

Second comparative example: without the inserted film 28.

Each thickness and each material of the lamination film 18 are the same as the piezoelectric thin film resonator having a resonance frequency of 2 GHz illustrated in FIG. 1A to FIG. 1D. The piezoelectric film 14 has AlN as a main component. The resonance region 50 has an ellipse shape in which the short axis length is 90 µm and the long axis length is 140 µm. The inserted film 28 has silicon oxide as a main component. The thickness of the inserted film 28 is approximately 150 nm. A width where the resonance region 50 and the inserted film 28 overlap (width of the outer circumference region 52) is approximately 3 µm. A width of a portion of the inserted film 28 out of the resonance region 50 (width of the region 56) is 6 µm. The length of the cutout 58 in the diameter direction (for example, the short axis direction) is 3 µm. The length of the cutout 58 in the circumference direction (for example, the long axis direction) is 3 µm. The inserted film 28 is provided in a center of the piezoelectric film 14 in the film thickness direction.

Figure 10A:
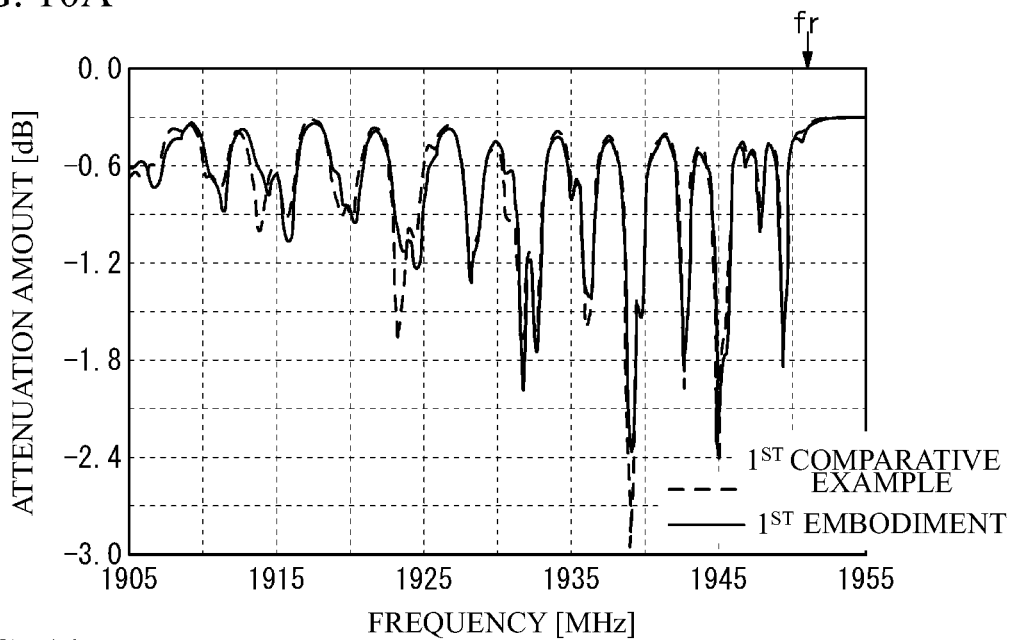
FIG. 10A and FIG. 10B illustrate an attenuation amount with respect to a frequency of resonators of a first embodiment and a first comparative example.
Figure 10B:
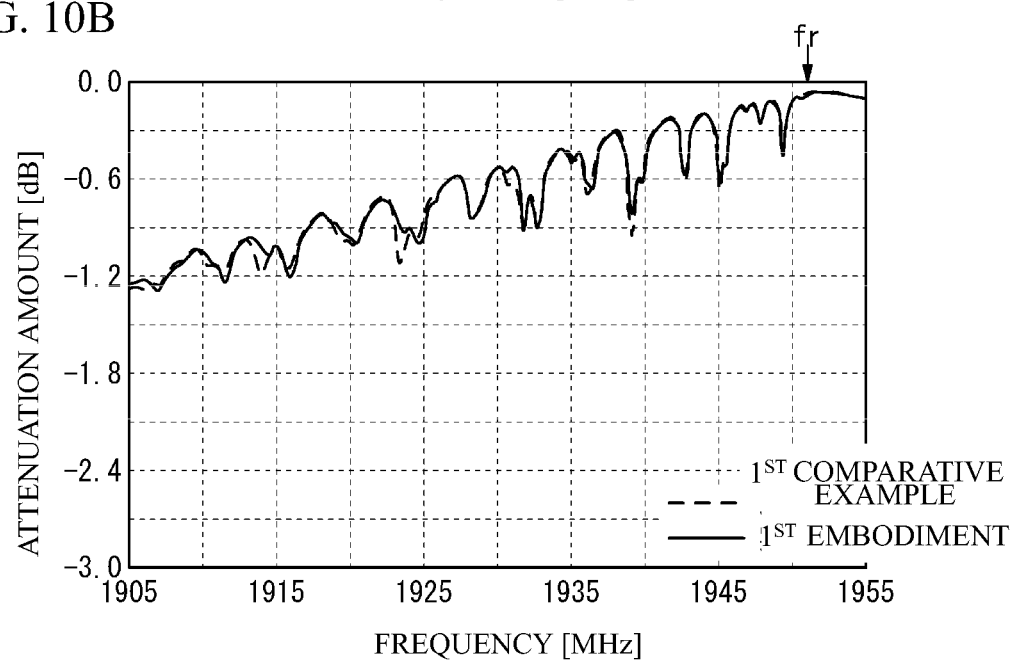

FIG. 10A and FIG. 10B illustrate an attenuation amount with respect to the frequency of the resonators of the first embodiment and the first comparative example. FIG. 10A and FIG. 10B respectively illustrate the S11 and the S21. The resonance frequency fr is 1951.5 MHz. The inserted film 28 and the cutout 58 have the same shape as FIG. 3B. As illustrated in FIG. 10A and FIG. 10B, the spurious of the first embodiment is smaller than that of the first comparative example, in the S11 and the S21.

Figure 11:
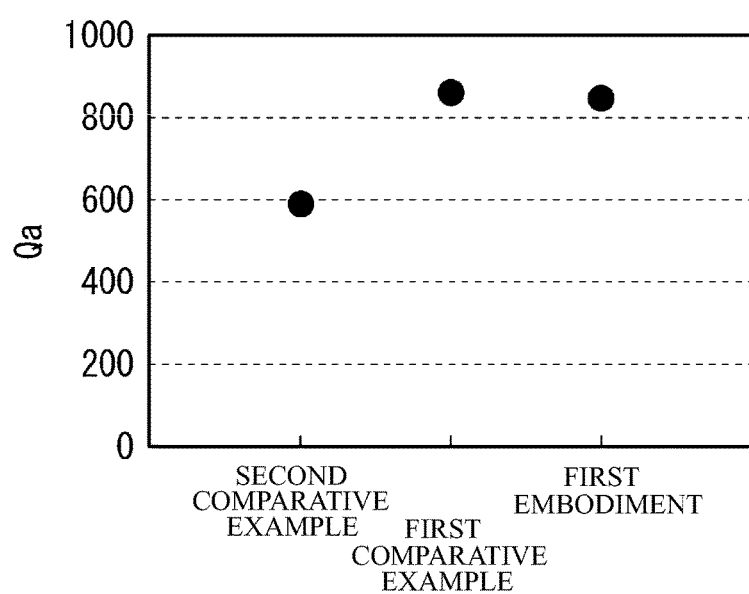
FIG. 11 illustrates a Q value of an anti-resonance frequency of resonators of a first embodiment, a first comparative example and a second comparative example.

FIG. 11 illustrates a Q value of an anti-resonance frequency of the resonators of the first embodiment, the first comparative example and the second comparative example. The Q value of the first embodiment is higher than that of the second comparative example and is substantially the same as that of the first comparative example. In this manner, the Q value of the first embodiment is as high as that of the first comparative example. The spurious of the first embodiment can be more suppressed than that of the first comparative example.

Figure 12:
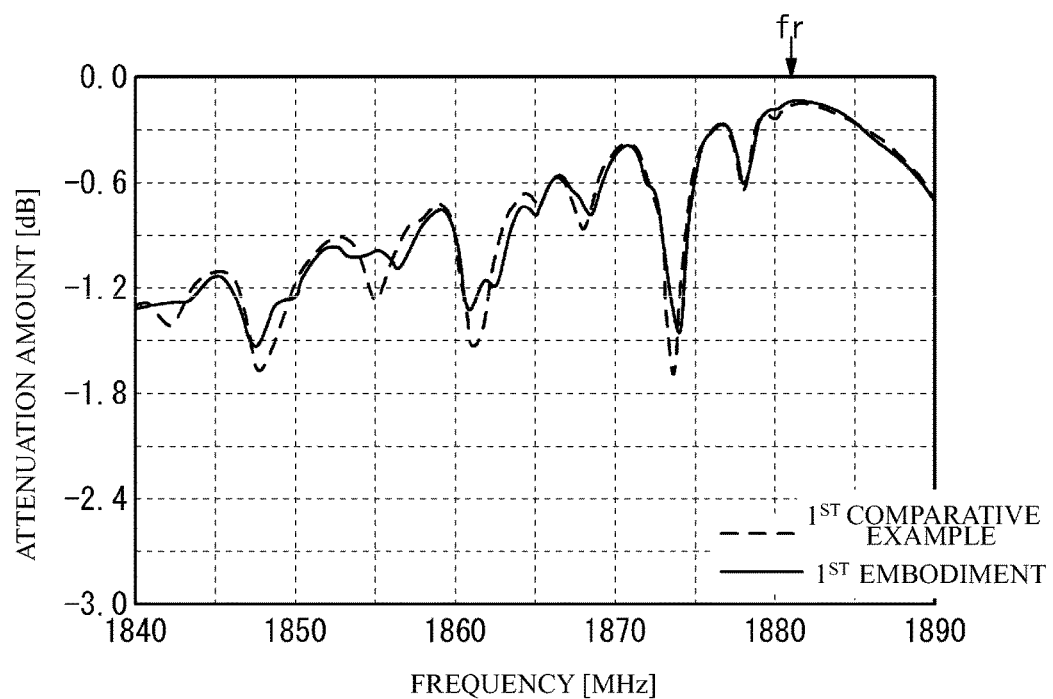
FIG. 12 illustrates an attenuation amount from a frequency of a resonator of a first embodiment.

Results of the inserted film 28 and the cutout 58 having the same shape as FIG. 6B are shown. FIG. 12 illustrates an attenuation amount from the frequency of the resonator of the first embodiment. FIG. 12 illustrates the S21. The resonance frequency fr is 1881.5 MHz. As illustrated in FIG. 12, the spurious of the first embodiment is smaller than that of the first comparative example in the S21, even if the cutout 58 has the same shape as FIG. 6B.

It is confirmed that the spurious of the resonators that have the inserted film 28 and the cutout 58 having another shape of FIG. 4A to FIG. 6C is more suppressed than the first comparative example.

As illustrated in FIG. 8A and FIG. 8B, when the inserted film 28 is provided, the Q value can be improved. However, the spurious may occur because of an acoustic wave reflected at an inner circumference of the inserted film 28. In the first embodiment, the cutout 58 is formed in the resonance region 50 of the inserted film 28. Thus, the spurious can be suppressed.

The cutout 58 may be formed in a part of the outer circumference region 52 in a diameter direction. However, it is preferable that the cutout 58 extends to the outer circumference of the resonance region 50 from the center region 54.

That is, it is preferable that the cutout 58 divides the outer circumference region 52. Thus, the spurious can be suppressed. And, the cutout 58 may extend to outside of the resonance region 50. Further, the cutout 58 may divide the inserted film 28.

It is preferable that the outer circumference of the resonance region 50 and the internal circumference of the inserted film 28 have a similarity relationship except for the cutout 58. In this case, the Q value can be improved. For example, when a concavity and convexity is formed in a whole of the internal circumference of the inserted film 28, the Q value is not improved.

It is preferable that the resonance region 50 has an ellipse shape, and the cutout 58 is formed around the short axis of the resonance region 50. An acoustic wave propagating in the short axis direction has influence on the spurious. Therefore, the spurious can be more suppressed when the cutout 58 is formed around the short axis. A plurality of the cutouts 58 may be formed on one side. From a viewpoint of improvement of the Q value, it is preferable that five or less number of the cutouts 58 are formed on one side. From a viewpoint of the improvement of the Q value, a width of the cutout 58 in a circumference direction is equal to or less than the length of the cutout 58 in the diameter direction.

In order to improve the Q value, it is preferable that the cutout 58 is not formed around the long axis. For example, it is preferable that the cutout 58 is formed only around the short axis.

Second Embodiment

Figure 13A:
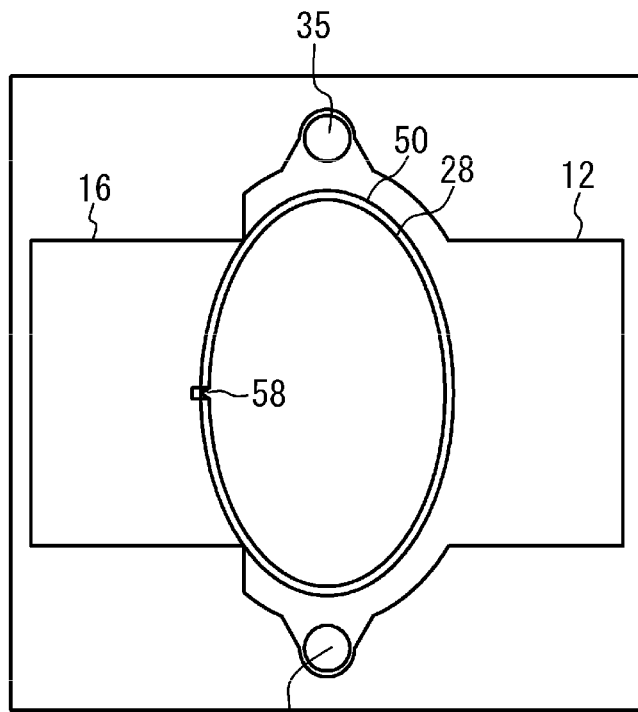
FIG. 13A and FIG. 13B illustrate a plane view of a vicinity of an inserted film of a second embodiment.
Figure 13B:
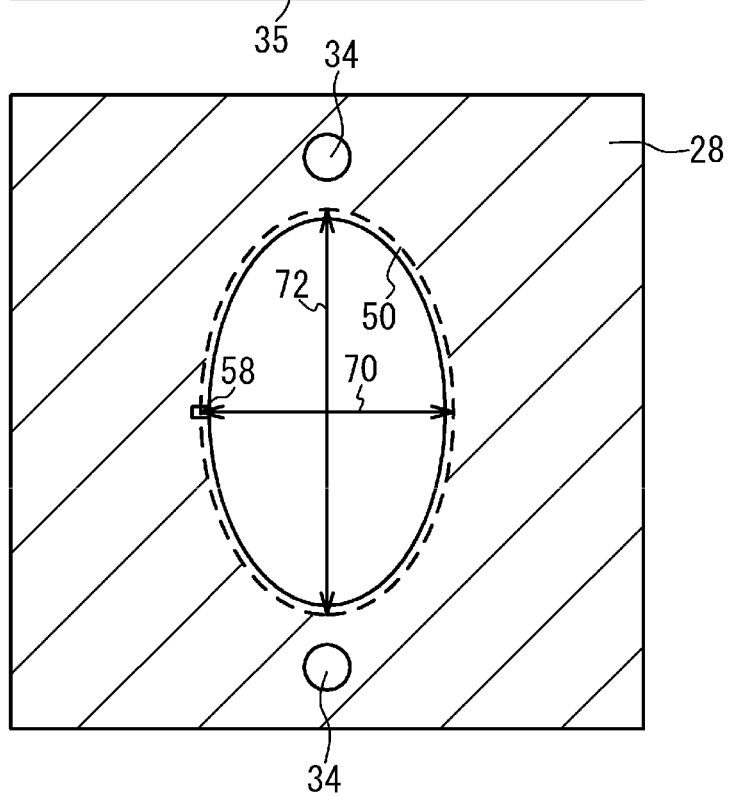

FIG. 13A and FIG. 13B illustrate a plane view of a vicinity of an inserted film of a second embodiment. As illustrated in FIG. 13B, the inserted film 28 continuously extends toward outside of the resonance region 50. The hole 34 communicating with the hole portion 35 is formed. The cutout 58 is formed around the short axis of the inserted film 28. The cutout 58 has a rectangular shape. Other structures are the same as FIG. 3A and FIG. 3B in the first embodiment. Therefore, an explanation of the structures is omitted.

As in the case of the first embodiment, the inserted film 28 may overlap the resonance region 50. The inserted film 28 may extend to the region 56 out of the resonance region 50. The inserted film 28 may be formed only in the resonance region 50 and the region 56. As in the case of the second embodiment, the inserted film 28 may be formed in the whole out of the resonance region 50. The inserted film 28 may be formed only in the resonance region 50.

Third Embodiment

Figure 14A:
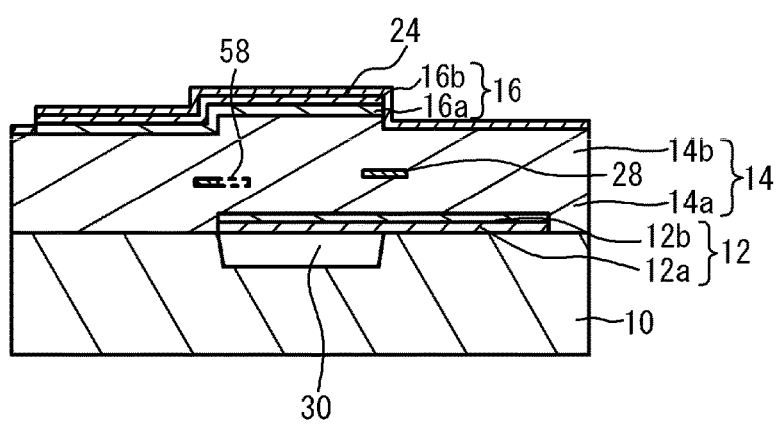
FIG. 14A illustrates a cross sectional view of a piezoelectric thin film resonator in accordance with a third embodiment.
Figure 14B:
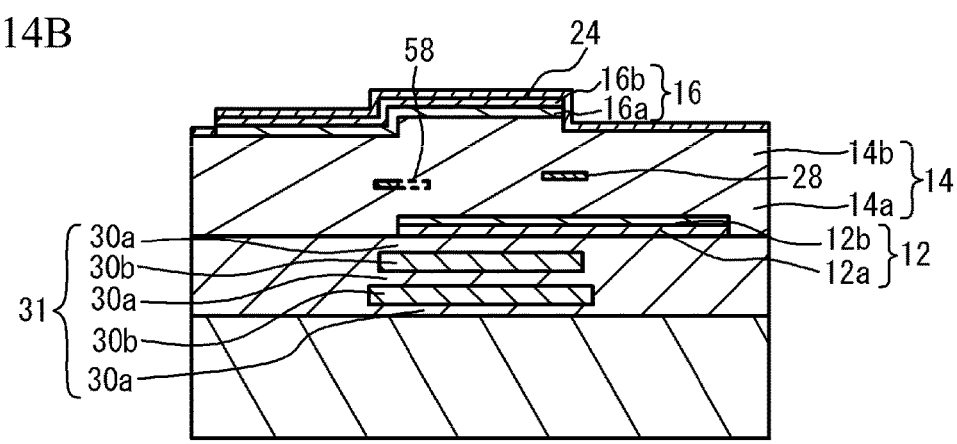
FIG. 14B illustrates a cross sectional view of a piezoelectric thin film resonator in accordance with a modified embodiment of a third embodiment.

A third embodiment is an embodiment in which the structure of the cavity is changed. FIG. 14A illustrates a cross sectional view of a piezoelectric thin film resonator in accordance with the third embodiment. FIG. 14B illustrates a cross sectional view of a piezoelectric thin film resonator in accordance with a modified embodiment of the third embodiment. As illustrated in FIG. 14A, the lamination film 18 of the resonance region 50 does not have the dome shape but has a flat shape. A bulge is formed on the upper face of the substrate 10. The lower electrode 12 has a flat shape on the substrate 10. Thus, the cavity 30 is formed in a recess of the substrate 10. The cavity 30 is formed so as to include the resonance region 50. Other structures are the same as the first embodiment. Therefore, an explanation of the structures is omitted. The cavity 30 may be formed so as to penetrate the substrate 10. An insulating film may contact the lower face of the lower electrode 12. That is, the cavity 30 may be formed between the substrate 10 and the insulating film contacting the lower electrode 12. The insulating film may be an aluminum nitride film.

As illustrated in FIG. 14B, the lamination film 18 of the resonance region 50 does not have the dome shape but has a flat shape. An acoustic mirror 31 is formed on a face of the lower electrode 12 of the resonance region 50 that is opposite to the piezoelectric film 14. The acoustic mirror 31 has a structure in which a film 30a having low acoustic impedance and a film 30b having high acoustic impedance are alternately provided. A thickness of the film 30a and the film 30b is, for example, $\lambda/4$ ($\lambda$ is a wavelength of an acoustic wave). The lamination number of the film 30a and the film 30b can be arbitrarily set. Other structures are the same as the first embodiment. Therefore, an explanation of the structures is omitted.

In the third embodiment and the modified embodiment, the inserted film 28 may be formed outside of the resonance region 50 as in the case of the second embodiment. The inserted film 28 may be formed only in the resonance region 50.

As in the cases of the first embodiment to the third embodiment, the piezoelectric thin film resonator may be an FBAR (Film Bulk Acoustic Resonator) in which the cavity 30 is formed between the substrate 10 and the lower electrode 12 in the resonance region 50. As in the case of the modified embodiment of the third embodiment, the piezoelectric thin film resonator may be an SMR (Solidly Mounted Resonator) in which the resonance region 50 has the acoustic mirror 31 that reflects an acoustic wave propagating the piezoelectric film 14 under the lower electrode 12.

In the first embodiment to the third embodiment and the modified embodiment, a description is given of embodiments in which the resonance region 50 has an ellipse shape. However, the resonance region 50 may have another shape. For example, the resonance region 50 may have another polygonal shape such as a tetragon shape or a pentagon shape.

Fourth Embodiment

Figure 15:
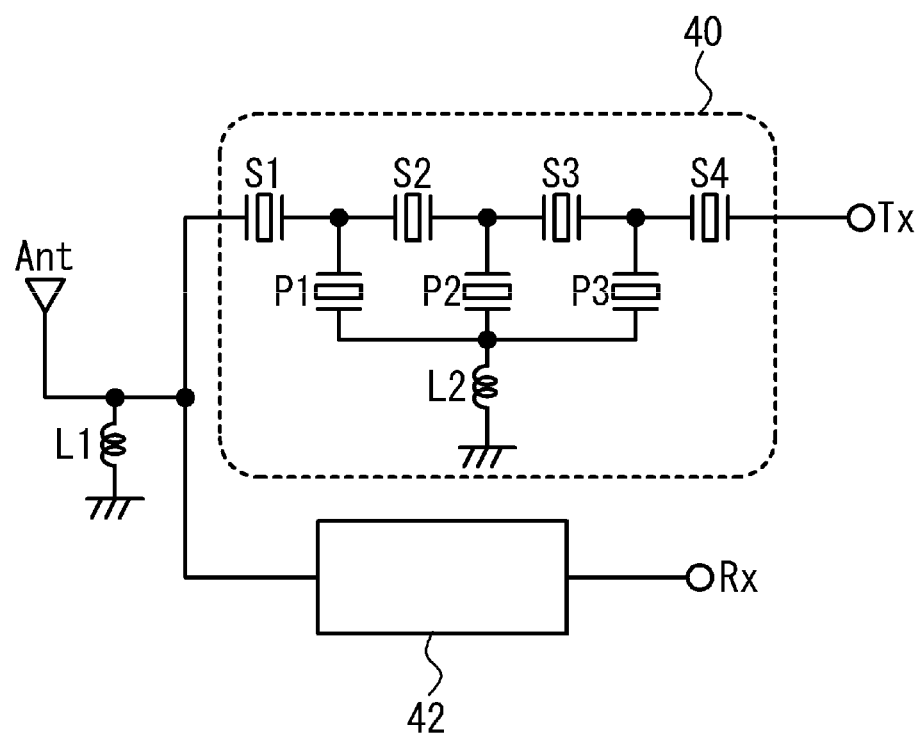
FIG. 15 illustrates a circuit diagram of a duplexer in accordance with a fourth embodiment.

A fourth embodiment is an embodiment of a duplexer. FIG. 15 illustrates a circuit diagram of a duplexer in accordance with the fourth embodiment. As illustrated in FIG. 15, the duplexer has a transmit filter 40 and a receive filter 42. The transmit filter 40 is connected between a common terminal Ant and a transmit terminal Tx. The receive filter 42 is connected between the common terminal Ant and a receive terminal Rx. An inductor L1 is provided between the common terminal Ant and a ground as a matching circuit. The transmit filter 40 transmits a signal having a transmit band of signals input from the transmit terminal Tx through the common terminal Ant as a transmit signal, and suppresses the signals having the other frequency. The receive filter 42 transmits a signal having a receive band of signals input from the common terminal Ant through the receive terminal Rx as a receive signal, and suppresses the signals having the other frequency. The inductor L1 performs an impedance matching so that the transmit signal passing through the transmit filter 40 is not leaked to the receive filter 42 and is output from the common terminal Ant.

The transmit filter 40 is a ladder type filter. One or more series resonators S1 to S4 are connected in series between the transmit terminal Tx (input terminal) and the common terminal Ant (output terminal). One or more parallel resonators P1 to P3 are connected in parallel between the transmit terminal Tx and the common terminal Ant. Ground sides of the parallel resonators P1 to P3 are grounded via the inductor L2 in common. The number or connection of the series resonators, the parallel resonators and the inductors can be arbitrarily changed in order to achieve desirable transmission characteristic. At least one of the series resonators S1 to S4 and the parallel resonators P1 to P3 may be one of the piezoelectric thin film resonators of the first embodiment to the third embodiment and the modified embodiment.

Figure 16A:
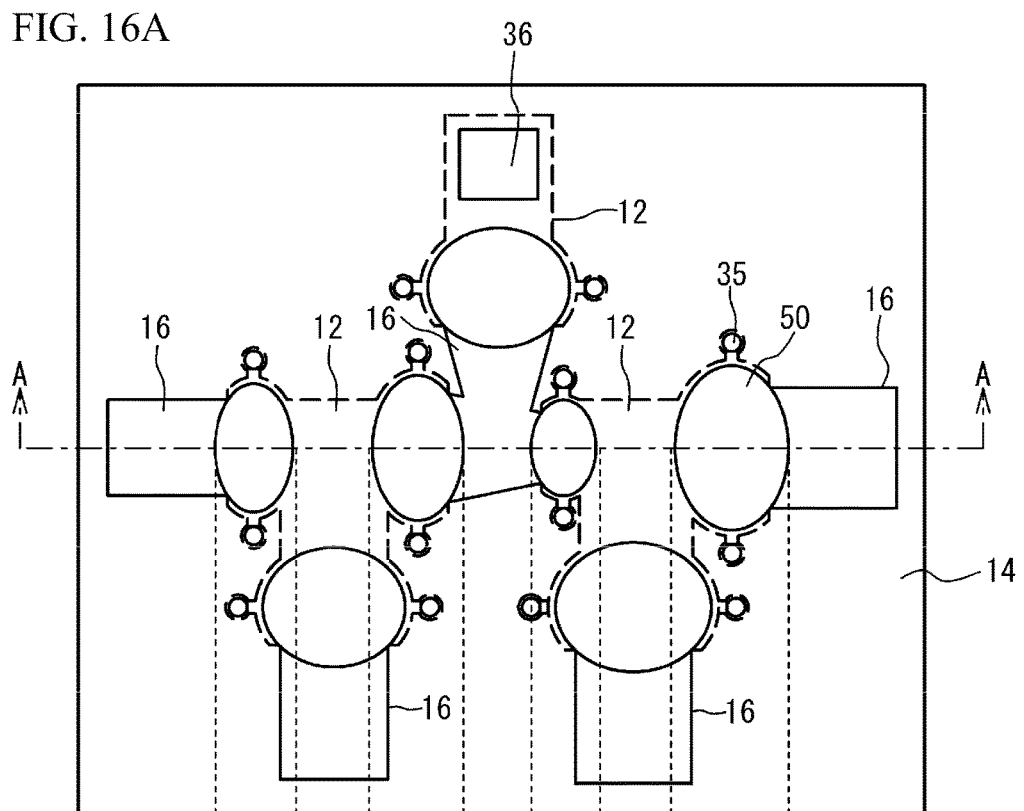
FIG. 16A illustrates a plane view and a cross sectional view of a transmit filter.
Figure 16B:
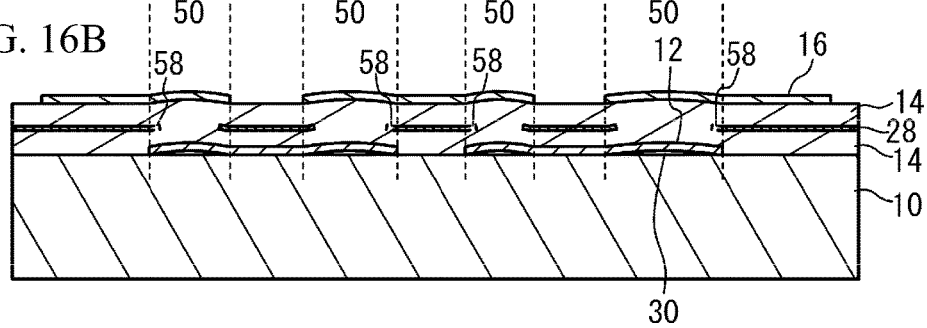
FIG. 16B illustrates a cross sectional view taken along a line A-A of FIG. 16A.
Figure 17:
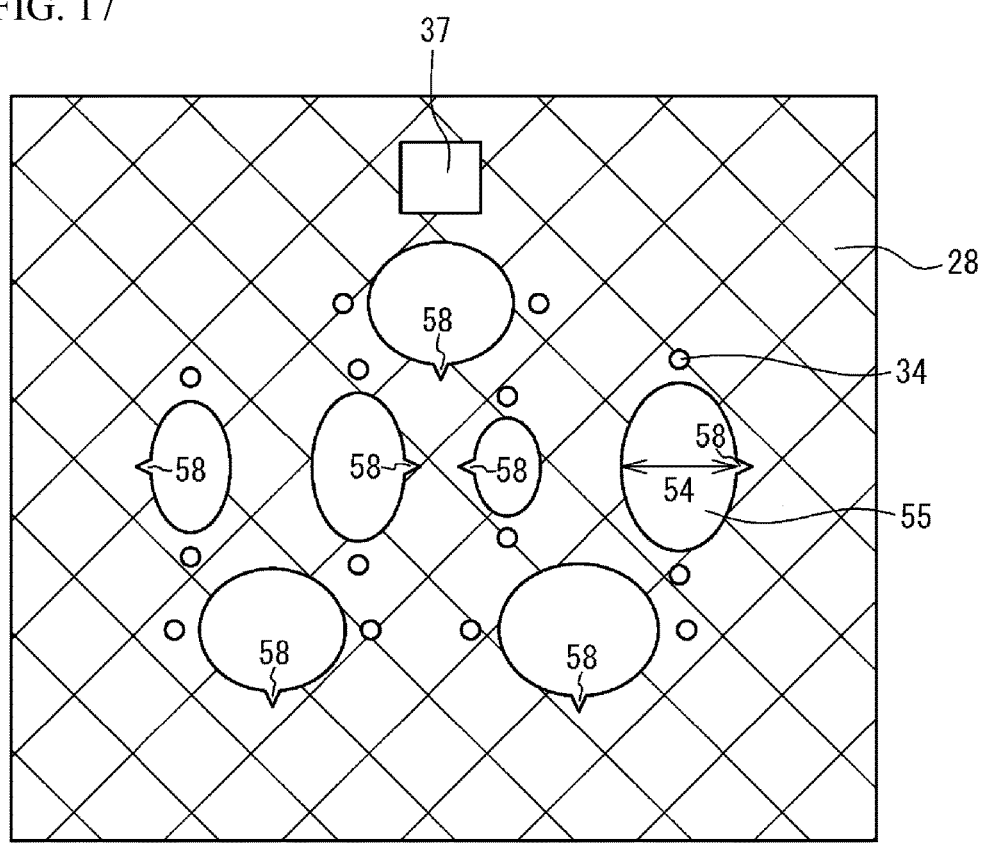
FIG. 17 illustrates a plane view of an inserted film of a transmit filter.

FIG. 16A illustrates a plane view and a cross sectional view of the transmit filter. FIG. 16B illustrates a cross sectional view taken along a line A-A of FIG. 16A. FIG. 17 illustrates a plane view of an inserted film of the transmit filter. As illustrated in FIG. 16A and FIG. 16B, the piezoelectric thin film resonators in accordance with the second embodiment may be formed on the same substrate 10 and may be used as a ladder type filter. An opening 36 is formed in the piezoelectric film 14, and an opening is formed in the inserted film 28. The lower electrode 12 can be electrically connected with an outer component via the opening 36 and the opening of the inserted film 28. The cutout 58 is formed in the inserted film 28. Other structures are the same as the first embodiment. An explanation of the structures is omitted. The size and the shape of the resonance regions 50 of the resonators S1 to S4 and P1 to P3 can be arbitrarily changed.

The receive filter 42 may be a ladder type filter or a multiplex mode filter. At least one of the transmit filter 40 and the receive filter 42 may be a ladder type filter or a lattice type filter. At least one of the resonators of the transmit filter 40 and the receive filter 42 may be one of the piezoelectric thin filter resonators of the first embodiment to the third embodiment and the modified embodiment.

The filter includes one of the piezoelectric thin film resonators of the first to the third embodiments and the modified embodiment. Thus, the Q value of the resonator can be improved. And the skirt characteristic of the filter can be improved. And, the spurious around the resonance frequency is suppressed. Therefore, the loss of the pass band can be improved.

At least one of the transmit filter 40 and the receive filter 42 may be used as the filter including one of the piezoelectric thin film resonators of the first embodiment to the third embodiment and the modified embodiment.

The present invention is not limited to the specifically described embodiments, but other embodiments and variations may be made without departing from the scope of the claimed invention.

What is claimed is:

1. A piezoelectric thin film resonator comprising:
a substrate;
a piezoelectric film provided on the substrate;
a lower electrode and an upper electrode that sandwich at least a part of the piezoelectric film and face with each other; and
an inserted film that is inserted in the piezoelectric film, the inserted film being provided on an outer circumference region in a resonance region in which the lower electrode and the upper electrode sandwich the piezoelectric film and face with each other, and being not provided in a center region of the resonance region, the inserted film having a cutout in the resonance region at a side to which the lower electrode extends from the resonance region in a plan view.

2. The piezoelectric thin film resonator as claimed in claim 1, wherein the cutout extends to an outer circumference of the resonance region.

3. The piezoelectric thin film resonator as claimed in claim 1, wherein an outer circumference of the resonance region and an inner circumference of the inserted film have a similarity relationship except for the cutout.

4. The piezoelectric thin film resonator as claimed in claim 1, wherein the resonance region has an ellipse shape.

5. The piezoelectric thin film resonator as claimed in claim 4, wherein the cutout is formed around a short axis of the resonance region.

6. The piezoelectric thin film resonator as claimed in claim 1, wherein a Young's modulus of the inserted film is smaller than a Young's modulus of the piezoelectric film.

7. The piezoelectric thin film resonator as claimed in claim 1, wherein the piezoelectric film has aluminum nitride as a main component.

8. The piezoelectric thin film resonator as claimed in claim 1, wherein a cavity is formed between the substrate and the lower electrode or an insulating film contacting the lower electrode.

9. The piezoelectric thin film resonator as claimed in claim 1 further comprising an acoustic mirror that reflects an acoustic wave propagating in the piezoelectric film toward an opposite side of the lower electrode with respect to the piezoelectric film.

10. A filter comprising
a piezoelectric thin film resonator as claimed in claim 1.

11. A duplexer comprising
a transmit filter and a receive filter,
wherein at least one of the transmit filter and the receive filter is the filter as claimed in claim 10.

12. The piezoelectric thin film resonator as claimed in claim 1, wherein the cutout has a substantially triangle shape in a plan view.

13. A piezoelectric thin film resonator comprising:
a substrate;
a piezoelectric film provided on the substrate and including a first piezoelectric film and a second piezoelectric film provided on the first piezoelectric film;
a lower electrode and an upper electrode that sandwich at least a part of the piezoelectric film and face with each other, the first piezoelectric film being provided on the lower electrode, the upper electrode being provided on the second piezoelectric film; and
an inserted film that is inserted between the first piezoelectric film and the second piezoelectric film, the inserted film being provided on an outer circumference region in a resonance region in which the lower electrode and the upper electrode sandwich the piezoelectric film and face with each other, and being not provided in a center region of the resonance region, the inserted film having a cutout in the resonance region,
wherein a distance between an inner circumference and an outer circumference of the insertion film in the resonance region and in a region in which the cutout is located is smaller than a distance between the inner circumference and the outer circumference of the insertion film in the resonance region and in a region in which the cutout is not located.

14. A piezoelectric thin film resonator comprising:
a substrate;
a piezoelectric film provided on the substrate;
a lower electrode and an upper electrode that sandwich at least a part of the piezoelectric film and face with each other; and
an inserted film that is inserted in the piezoelectric film, the inserted film being provided on an outer circumference region in a resonance region in which the lower electrode and the upper electrode sandwich the piezoelectric film and face with each other, and being not provided in a center region of the resonance region, the inserted film having a cutout in the resonance region, wherein the cutout is provided at a side to which the upper electrode extends from the resonance region in a first direction in a plan view and is located substantially on a virtual center line of a portion of the upper electrode that extends from the resonance region in the first direction, a width of the cutout in a direction perpendicular to the first direction is less than a width of said extended portion of the upper electrode.

* * * * *